United States Patent
Nakashima et al.

(12)

(10) Patent No.: US 8,522,802 B2
(45) Date of Patent: Sep. 3, 2013

(54) OPTICAL IRRADIATION EQUIPMENT AND OPTICAL IRRADIATION METHOD

(75) Inventors: Akinobu Nakashima, Himeji (JP); Shinji Sugioka, Himeji (JP); Masanori Yamaguchi, Himeji (JP); Hideki Fujitsugu, Himeji (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 241 days.

(21) Appl. No.: 13/013,875

(22) Filed: Jan. 26, 2011

(65) Prior Publication Data
US 2011/0181188 A1 Jul. 28, 2011

(30) Foreign Application Priority Data
Jan. 28, 2010 (JP) .................... 2010-016127

(51) Int. Cl.
*B08B 3/00* (2006.01)
(52) U.S. Cl.
USPC .............................. 134/105; 134/1
(58) Field of Classification Search
USPC ................. 313/35, 36; 134/1, 54, 105
See application file for complete search history.

(56) References Cited

U.S. PATENT DOCUMENTS

| 4,868,450 A | * | 9/1989 | Colterjohn, Jr. ............ 313/36 |
| 6,254,689 B1 | * | 7/2001 | Meder .................. 134/1 |
| 7,527,695 B2 | * | 5/2009 | Ikuta .................. 134/1 |
| 2008/0090170 A1 | | 4/2008 | Yoneda |
| 2009/0267267 A1 | | 10/2009 | Yoneda et al. |
| 2010/0044921 A1 | * | 2/2010 | Ito .................. 264/402 |
| 2011/0132394 A1 | * | 6/2011 | Rastegar et al. ........... 134/1 |

FOREIGN PATENT DOCUMENTS

| JP | 8-236492 A | 9/1996 |
| JP | 2000-194142 A | 7/2000 |

* cited by examiner

*Primary Examiner* — Thuy Vinh Tran
(74) *Attorney, Agent, or Firm* — Roberts Mlotkowski Safran & Cole, P.C.; David S. Safran

(57) ABSTRACT

An optical irradiation equipment provided with a cage body having an UV radiation transmission window, and an excimer lamp which is arranged in an interior of said cage body, wherein gas flow openings being connected to one of a cooling gas supply mechanism and a cooling gas suction mechanism are provided at a periphery of said UV radiation transmission window.

3 Claims, 7 Drawing Sheets

OPTICAL IRRADIATION EQUIPMENT AND OPTICAL IRRADIATION METHOD

BACKGROUND OF THE INVENTION

1. Field of the Invention

The present invention relates to an optical irradiation equipment and an optical irradiation method, and relates particularly to an optical irradiation equipment and an optical irradiation method which are ideal for the dry cleaning treatment of the surface of templates in a nanoimprint device.

2. Description of Related Art

In the manufacture of semiconductor chips and biochips, recently the photo-nanoimprint technology has gained attention as a method by means of which it is possible to produce at lower costs as compared to the known pattern forming method using photolithography and etching.

In the pattern forming method using this photo-nanoimprint technology, a pattern forming material layer is formed on a substrate such as a wafer, on which a pattern is to be formed, by applying a liquid photocurable resin, a template (a mold) on which a pattern being a negative of the pattern to be formed has been prepared is brought into contact with this pattern forming material layer, and in this condition the pattern forming material layer is irradiated with UV rays and cured. Then, a process to detach the template from the obtained layer of cured resin is performed (see JP-A-2000-194142 and US 2008/0090170 A1 (corresponding to JP-A-2008-91782)).

If in this pattern forming method contaminants and the like are present on the surface of the template, defects are generated in the obtained pattern. Therefore it is necessary to perform a cleaning treatment of the surface of the template. For the method to perform the cleaning treatment of the template, the wet cleaning method using an organic solvent or a chemical such as an alkali or an acid is known (see US 2009/0267267 A1 (corresponding to JP-A-2009-266841)). But with this wet cleaning method there is the risk that a part of the template is dissolved by the organic solvent or the chemical and the shape of the pattern is altered. Then, if remains of the photocurable resin or the like adhere to said template when the template is detached from the cured resin layer, it becomes necessary to perform the cleaning treatment of the template every time a pattern forming has been finished. Because quite a long time is necessary for the cleaning treatment, there is the problem of a substantial decrease of the productivity.

In the manufacture of liquid crystal display elements, for example, an optical cleaning treatment device is used as the means for the cleaning treatment of glass substrates (see JP-A-8-236492 (1996)). But with the known optical cleaning treatment devices, the following problems occur when the cleaning treatment of a template is performed. For the templates in the photo-nanoimprint technology, templates from, for example, quartz glass are used, and the temperature control of the templates is extremely important from the aspects of the dimensional stability and the maintenance of the shape of the pattern. But when an optical cleaning treatment of a template is performed by a known optical cleaning treatment device, the template is irradiated with UV rays at the time of the optical cleaning treatment or is subjected to radiant heat from the UV radiation transmission window of the optical cleaning treatment device. Therefore, there is the problem that the temperature of the template increases.

SUMMARY OF THE INVENTION

The present invention was made on the basis of the above-mentioned situation and has the object to provide an optical irradiation equipment and an optical irradiation method by means of which an irradiation with UV rays can be performed while an increase of the temperature of the object to be treated is suppressed.

The optical irradiation equipment of the present invention which is provided with a cage body having an UV radiation transmission window, and an excimer lamp which is arranged in the interior of this cage body, is characterized in that gas flow openings being connected to a cooling gas supply mechanism or a cooling gas suction mechanism are present at the periphery of said UV radiation transmission window.

Then, the optical irradiation equipment of the present invention which is provided with a cage body having an UV radiation transmission window, and an excimer lamp which is arranged in the interior of this cage body, and which is arranged such that said UV radiation transmission window is positioned opposite and with a gap to the pattern surface of a template in a nanoimprint device, is characterized in that gas flow openings being connected to a cooling gas supply mechanism or a cooling gas suction mechanism are present at the periphery of said UV radiation transmission window, and cooling gas is passed via said gas flow openings into the gap between said UV radiation transmission window and said template.

In the optical irradiation equipment of the present invention it is preferred that said excimer lamp has a discharge vessel with an overall shape of a flat plate, a high-voltage side electrode being arranged at one face of this discharge vessel, and an earth-side electrode being arranged at the other face of said discharge vessel, wherein the face of said discharge vessel at which said high-voltage side electrode is arranged is arranged such that it is positioned opposite to said UV radiation transmission window.

The optical irradiation method of the present invention wherein an optical irradiation equipment being provided with a cage body having an UV radiation transmission window, and an excimer lamp which is arranged in the interior of this cage body, is arranged such that said UV radiation transmission window is positioned opposite and with a gap to the pattern surface of a template in a nanoimprint device, is characterized in that said template is irradiated with UV rays while a cooling gas is passed via gas flow openings which are provided at the periphery of said UV radiation transmission window and which are connected to a cooling gas supply mechanism or a cooling gas suction mechanism into the gap between said UV radiation transmission window and said template.

As, according to the present invention, the UV radiation transmission window is cooled by the cooling gas passed via the gas flow openings provided at the periphery of the UV radiation transmission window, an irradiation of the object to be treated with UV rays can be performed while an increase of the temperature of the object to be treated by means of radiant heat from said UV radiation transmission window is suppressed.

As, according to the configuration which passes cooling gas via the gas flow openings into the gap between the UV radiation transmission window and the template being the object to be treated, a cooling of the template is performed in addition to the cooling of the UV radiation transmission window, an irradiation of the template with UV rays can be performed while an increase of the temperature of the template can be suppressed reliably.

As, according to the configuration in which the excimer lamp is arranged such that the face of the discharge vessel at which the high-voltage side electrode is arranged is positioned such that it opposes the UV radiation transmission window, no exterior discharge occurs between the excimer lamp and the cage body even though the distance between the other face of the discharge vessel at which the earth-side electrode is arranged and the inner face of the cage body is short, and therefore the thickness of the cage body can be rendered small and the distance between the one face of the discharge vessel emitting UV rays and the UV radiation transmission window can be rendered large, because of which an increase of the temperature of the UV radiation transmission window can be suppressed even more.

DETAILED DESCRIPTION OF THE INVENTION

Figure 1:
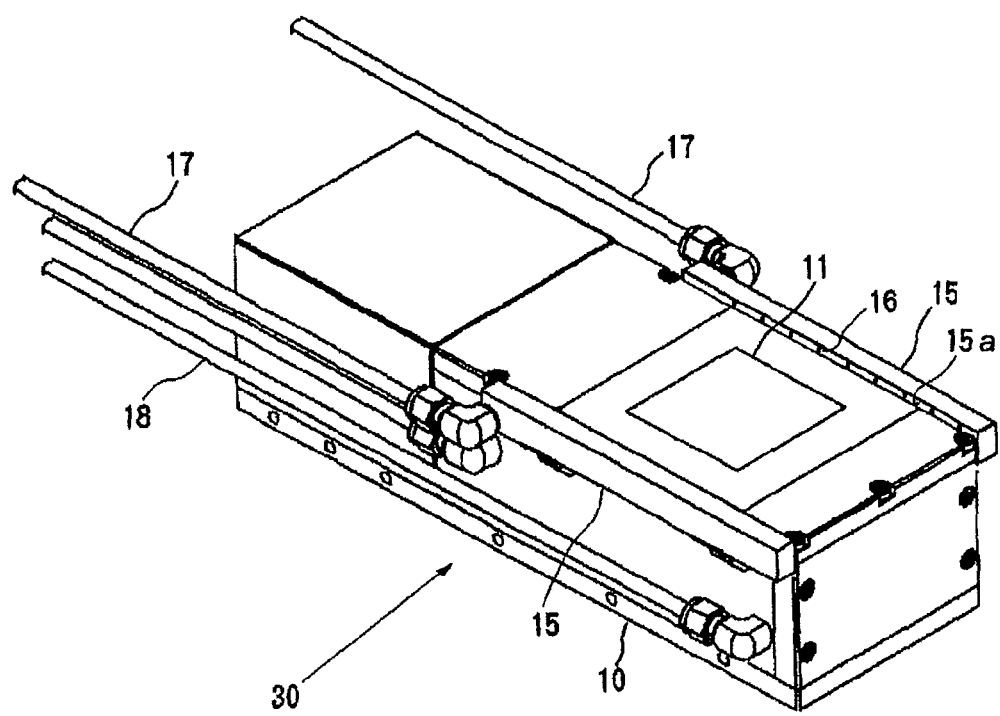
FIG. 1 is a schematic explanatory view showing the configuration of an example for the optical irradiation equipment according to the present invention.
Figure 2:
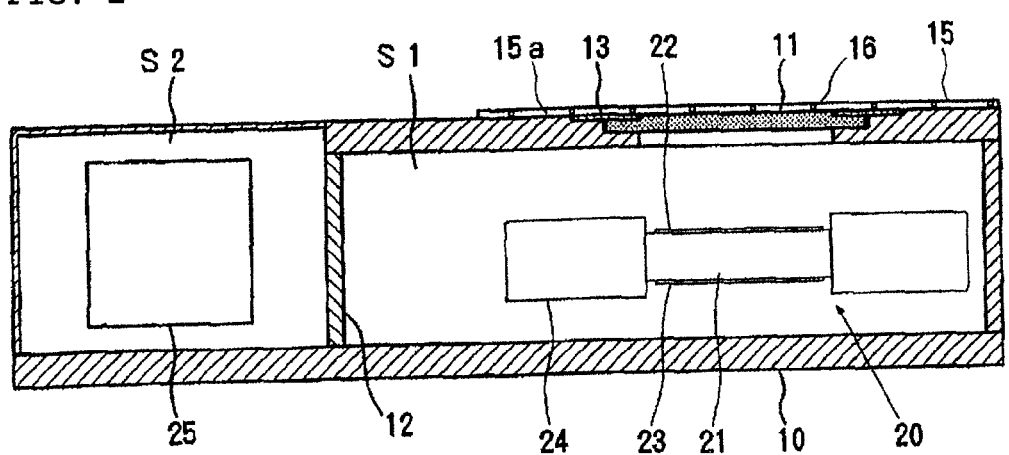
FIG. 2 is a schematic explanatory sectional view of the optical irradiation equipment shown in FIG. 1.

In the following, embodiments of the present invention will be explained in detail. FIG. 1 is an explanatory view showing the configuration of an example for the optical irradiation equipment according to the present invention, and FIG. 2 is an explanatory sectional view of the optical irradiation equipment shown in FIG. 1.

This optical irradiation equipment 30 is employed for the optical cleaning treatment of the surfaces of templates in a nanoimprint device and is used by arranging a UV radiation transmission window 11 being discussed later such that it opposes the pattern surface of a template 1 held by means of a template holding mechanism 2 via a gap. A cage body 10 of this optical irradiation equipment 10 has an approximately block-shaped external shape. In the interior of this cage body 10 a lamp accommodation chamber S1 and a circuit chamber S2 are arranged side by side via a partition wall 12, and in the upper face of the portion forming the lamp accommodation chamber S1 in the cage body 10 the UV radiation transmission window 11 consisting, for example, of quartz glass is provided such that it is fixed by a frame-shaped fixing plate 13.

Figure 3:
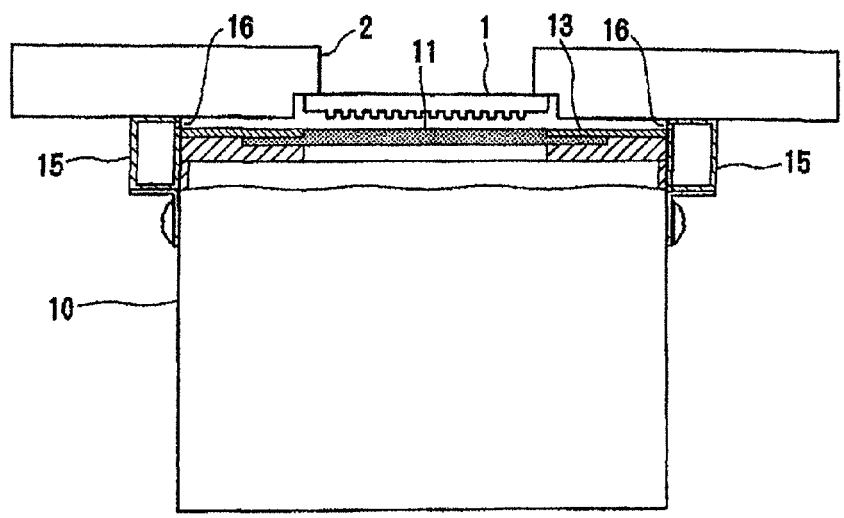
FIG. 3 is a schematic explanatory sectional view showing a cross-section of a part of the optical irradiation equipment shown in FIG. 1.

As is also shown in FIG. 3, a rectangular tube-shaped gas passage element 15 through which cooling gas is passed is provided along the upper edge part of both side faces of the cage body 10. To explain this concretely, each gas passage element 15 has a plurality of gas flow openings 16 which are formed such that they are arranged side by side along one side face of said gas passage element 15. This one side face of each gas passage element 15 is fixed such that it is arranged in contact with the side face of the cage body 10 with the exception of an upper edge part 15a. By means of this the gas flow openings 16 are positioned at the periphery of the UV radiation transmission window 11 in the cage body 10. The gas passage elements 15 are connected to a cooling gas supply mechanism (not shown) via cooling gas flow pipes 17.

In the lamp accommodation chamber S1 in the cage body 11 an excimer lamp 20 is arranged, while in the circuit chamber S2 a step-up transformer 25 etc. is arranged. The reference numeral 18 in FIG. 1 refers to a purge gas flow pipe supplying a purge gas such as, for example, nitrogen gas into the lamp accommodation chamber S1.

Figure 4:
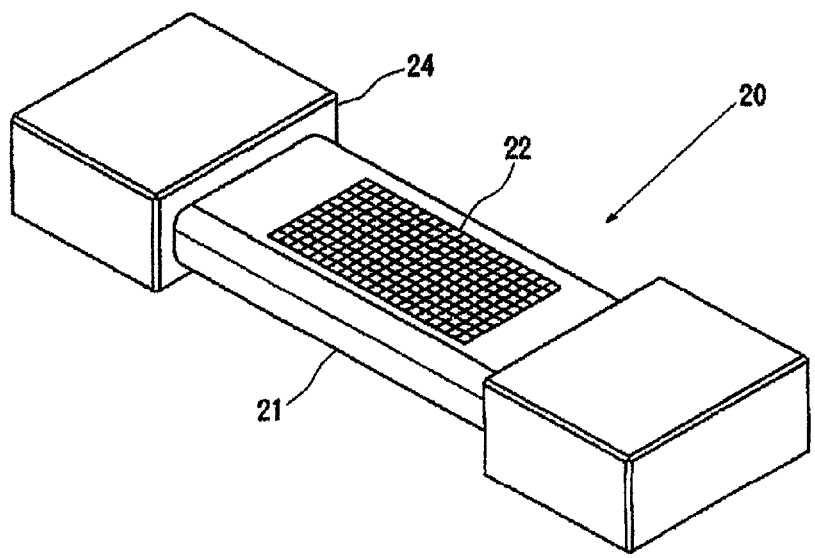
FIG. 4 is a schematic oblique view of the excimer lamp in the optical irradiation equipment shown in FIG. 1.
Figure 5:
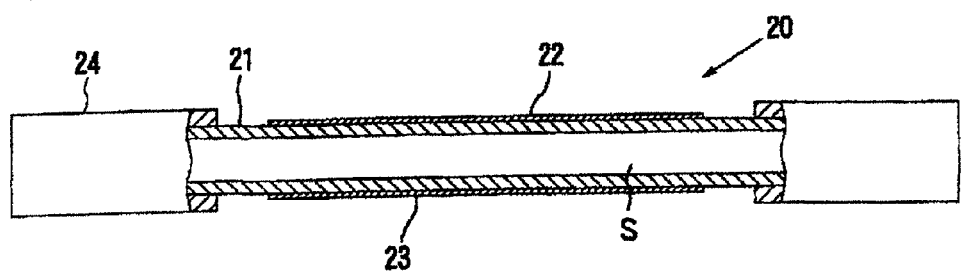
FIG. 5 is a schematic explanatory sectional view of the excimer lamp shown in FIG. 4.

FIG. 4 is an oblique view of the excimer lamp 20, and FIG. 5 is an explanatory sectional view of the excimer lamp 20 shown in FIG. 4. This excimer lamp 20 has a discharge vessel 21 with an overall shape of a flat plate in the interior of which a discharge space S is formed. Sockets 24 are provided at both ends of this discharge vessel 21, and in the discharge space S of said discharge vessel 21 a gas for excimers is enclosed air-tightly. At one face of the discharge vessel 21 a reticulate high-voltage side electrode 22 is provided, while a reticulate earth-side electrode 23 is arranged at the other face of said discharge vessel 21. Both the high-voltage side electrode 22 and the earth-side electrode 23 are connected to a high-frequency power source (not shown). Further, the face of the excimer lamp 20 at which the high-voltage side electrode 22 of the discharge vessel 21 is arranged is positioned such that it opposes the UV radiation transmission window 11 in the cage body 10.

For the material constituting the discharge vessel 21, a material with good permeability for vacuum UV radiation, concretely silica glass such as synthetic quartz glass, sapphire glass and the like, can be used.

For the material constituting the high-voltage side electrode 22 and the earth side electrode 23, a metallic material such as aluminium, nickel, gold and the like can be used. Further, the high-voltage side electrode 22 and the earth side electrode 23 can be formed by screen-printing a conductive paste containing the above-mentioned metallic material or by a vacuum deposition of the above-mentioned metallic material.

For the gas for excimers enclosed in the discharge space S of the discharge vessel 21, a gas which generates excimers emitting vacuum UV radiation, concretely a rare gas such as xenon, argon or krypton or a mixed gas consisting of a mixture from a rare gas and a halogen gas such as bromine, chlorine, iodine or fluorine, can be used. To show concrete examples for gases for excimers together with the wavelength of the emitted UV rays, xenon gas results in 172 nm, a mixed gas from argon and iodine results in 191 nm, and a mixed gas from argon and fluorine results in 193 nm. The enclosure pressure of the gas for excimers amounts to, for example, 10 to 100 kPa.

Figure 6:
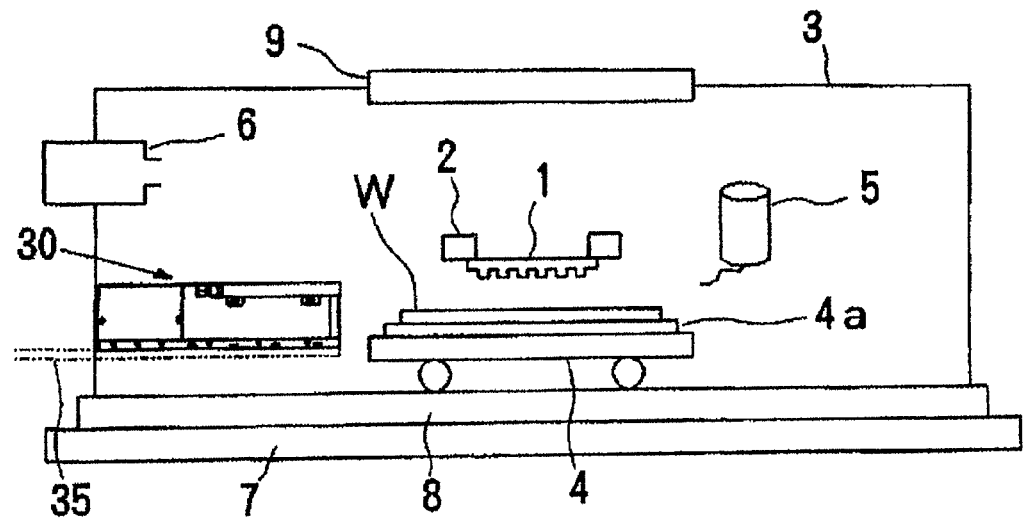
FIG. 6 is an explanatory view showing the schematic configuration of an example of a nanoimprint device being provided with the optical irradiation equipment of the present invention.
Figure 7:
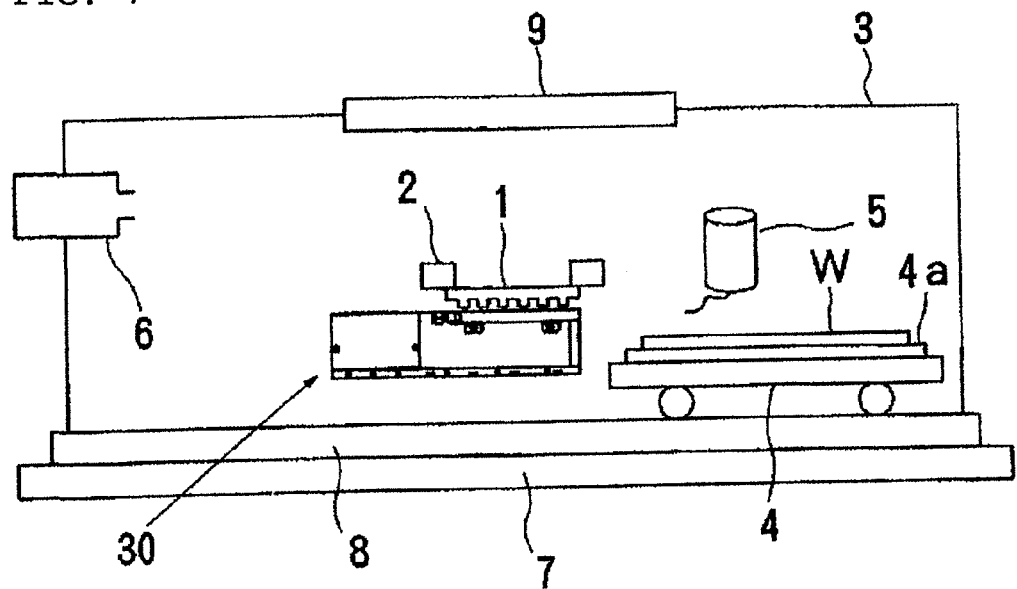
FIG. 7 is a schematic explanatory view showing the condition in which the UV radiation transmission window of the optical irradiation equipment has been arranged via a gap opposite to the pattern surface of a template in the nanoimprint device shown in FIG. 6.

FIG. 6 is an explanatory view showing the schematic configuration of an example of a nanoimprint device being provided with the optical irradiation equipment of the present invention. In this drawing, 1 refers to a template, 2 refers to a template holding mechanism holding the template 1, and 3 refers to a chamber. 4 refers to a movable wafer stage, and on this wafer stage 4 a wafer chuck 4a holding a wafer W is arranged. 5 refers to an ink-jet application means to apply a liquid photocurable resin being the pattern forming material (imprint material) onto the surface of the wafer W. 6 refers to a pressure exerting mechanism, 7 refers to a vibration-preventing table, 8 refers to a stage surface plate, and 9 refers to a UV radiation light source radiating UV rays to the pattern forming material layer consisting of the photocurable resin which has been formed on the wafer W. 30 is an optical irradiation equipment being configured such as shown in FIG. 1 and FIG. 2, and this optical irradiation equipment 30 is fixed on a transport arm 35 transporting said optical irradiation equipment 30 underneath the template 1.

In such a nanoimprint device, the wafer stage 4 on which a wafer W is held by the wafer chuck 4a is moved to a position beneath the application means 5. By means of applying a liquid photocurable resin onto the surface of the wafer W with this application means 5, a pattern forming material layer consisting of the photocurable resin is formed on the wafer W. Next, the wafer stage 4 is moved to a position beneath the template 1, and the template 1 is pressed into a contact with the pattern forming material layer having been formed on the wafer W by the pressure exerting mechanism 6. In this condition the pattern forming material layer is cured by means of radiating UV rays from the UV radiation light source 9 via the template 1 to the pattern forming material layer. The forming of the pattern at the wafer W is completed by subsequently peeling-off the template 1 from the obtained cured resin layer.

After such a forming of a pattern on a wafer W has been finished once or a plurality of times, the wafer stage 4 being loaded with a wafer W is retracted by moving it from the position beneath the template 1 to a lateral position, the optical irradiation equipment 30 is transported to the position beneath the template 1, and the UV radiation transmission window 11 (see FIG. 3) thereof is arranged such that it opposes the pattern surface of the template 1 via a gap. Here, the distance between the outer face of the UV radiation transmission window 11 and the pattern surface of the template 1 amounts to 0.3 to 10.0 mm.

Figure 8:
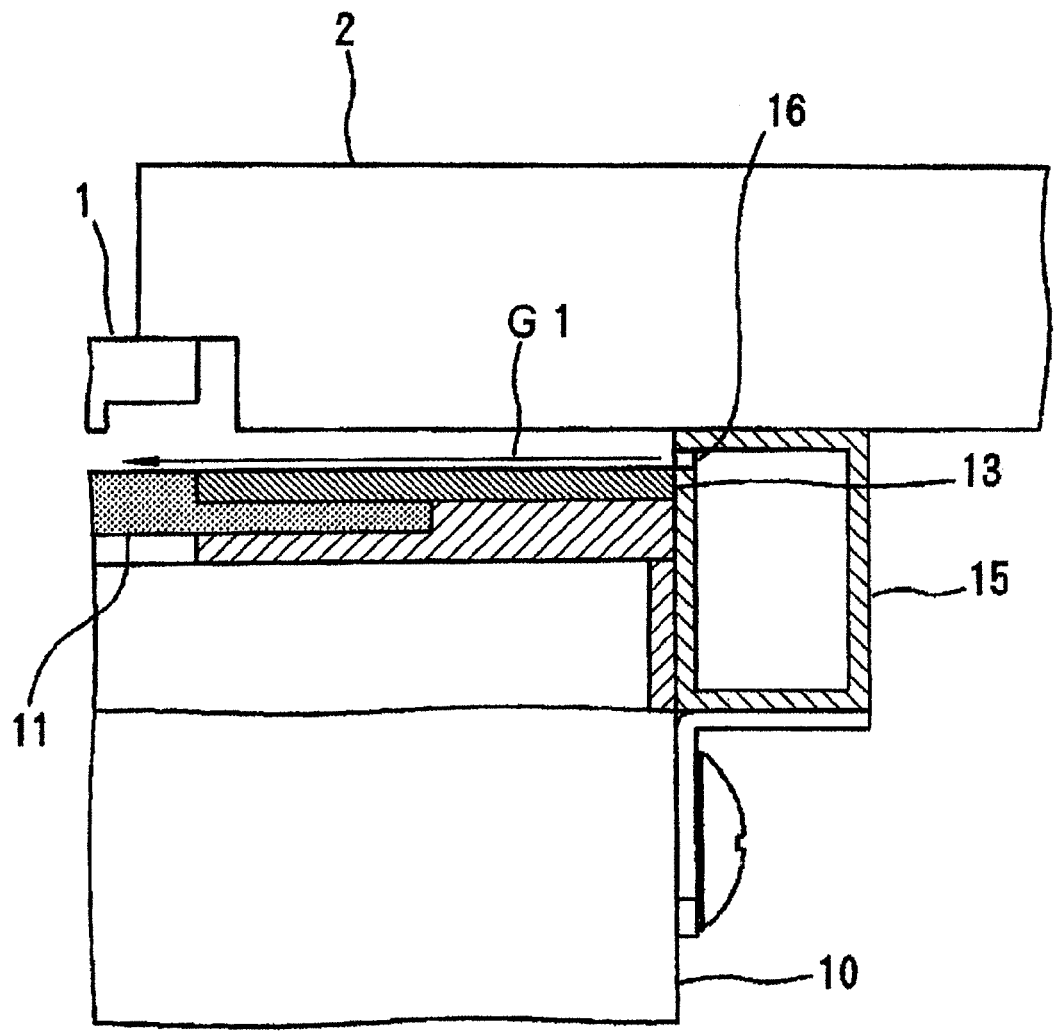
FIG. 8 is a schematic explanatory sectional view showing the condition in which cooling gas is passed into the gap between the template and the UV radiation transmission window by means of a cooling gas supply mechanism.

In the optical irradiation equipment 30 the cooling gas supply mechanism is operated, and by doing so cooling gas is supplied via the cooling gas flow pipes 17 to the gas passage elements 15. Thus, cooling gas G1 ejected from the gas flow openings 16 formed in the gas passage elements 15 is passed into the gap between the UV radiation transmission window 11 and the template 1, as is shown in FIG. 8. Then, in this state, the excimer lamp 20 is lighted by means of which UV rays from the excimer lamp 20 are radiated to the pattern surface of the template 1 via the UV radiation transmission window 11 and an optical cleaning treatment of the template 1 is obtained. Afterwards, the optical irradiation equipment 30 is transported and retracted from the position beneath the template 1, the wafer stage 4 loaded with a wafer W is moved to the position beneath the template 1, and the forming of the pattern on this wafer W is performed.

The flow amount of the cooling gas which is passed into the gap between the UV radiation transmission window 11 and the template 1 is, for example, 100 to 1000 l/min, and the temperature of the cooling gas is, for example, 10 to 35° C.

The time of the exposure of the template 1 to UV radiation is, for example, 3 to 3600 seconds.

As, according to the above-mentioned optical irradiation equipment 30, the UV radiation transmission window 11 and the template 1 are cooled by passing a cooling gas via gas flow openings 16 which are positioned at the periphery of the UV radiation transmission window 11 of the cage body 10 into the gap between the UV radiation transmission window 11 and the template 1 being the object to be treated, an UV irradiation treatment of said template 1 can be performed while an increase of the temperature of the template 1 because of the irradiation with UV rays and the radiant heat from the UV radiation transmission window 11 is suppressed reliably.

Because that face of the excimer lamp 20, at which the high-voltage side electrode 22 of the discharge vessel 21 is arranged is positioned such that it opposes the UV radiation transmission window 11, no exterior discharge occurs between the excimer lamp 20 and the cage body 10 even though the distance between the other face of the discharge vessel 21 at which the earth-side electrode 23 is arranged and the inner face of the cage body 10 is short, and therefore the thickness of the cage body 10 can be rendered small and the distance between the one face of the discharge vessel 21 emitting UV rays and the UV radiation transmission window 11 can be rendered large, because of which an increase of the temperature of the UV radiation transmission window 11 can be suppressed even more.

In the foregoing, a mode to carry out the present invention has been explained, but the present invention is not limited to the above-mentioned mode. It is possible to add various modifications.

In the present invention it suffices that the gas flow openings 16 are positioned at the periphery of the UV radiation transmission window 11. The specific locations of the gas passage elements 15 and the positions for the formation of the gas flow openings 16 can be suitably changed according to the dimensions of the template 1 being the object to be treated and the template holding mechanism 2 holding it.

Figure 9:
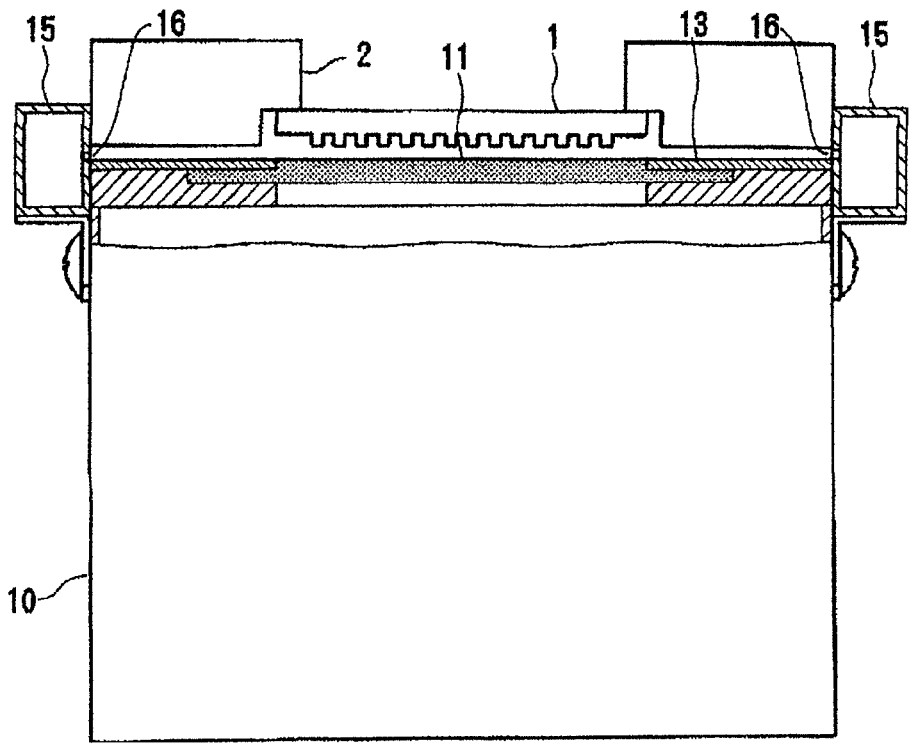
FIG. 9 is a schematic explanatory sectional view showing a modification of the optical irradiation equipment according to the present invention.

The optical irradiation equipment shown in FIG. 1 to FIG. 3, for instance, is an example in which the width (the size in the left-right direction in FIG. 3) of the template holding mechanism 2 is larger than the width of the cage body 10, but if the width of the template holding mechanism 2 is the same as the width of the cage body 10, it is also possible as shown in FIG. 9 to use gas passage elements 15 in which a plurality of gas flow openings 16 has been formed side by side along the axial direction of the tube at central positions of one side, and to arrange these one sides of the gas passage elements 15 such that they are contacting the side faces of the cage body 10, with the exception of the regions above the central positions in which these gas flow openings 16 have been formed.

Figure 10:
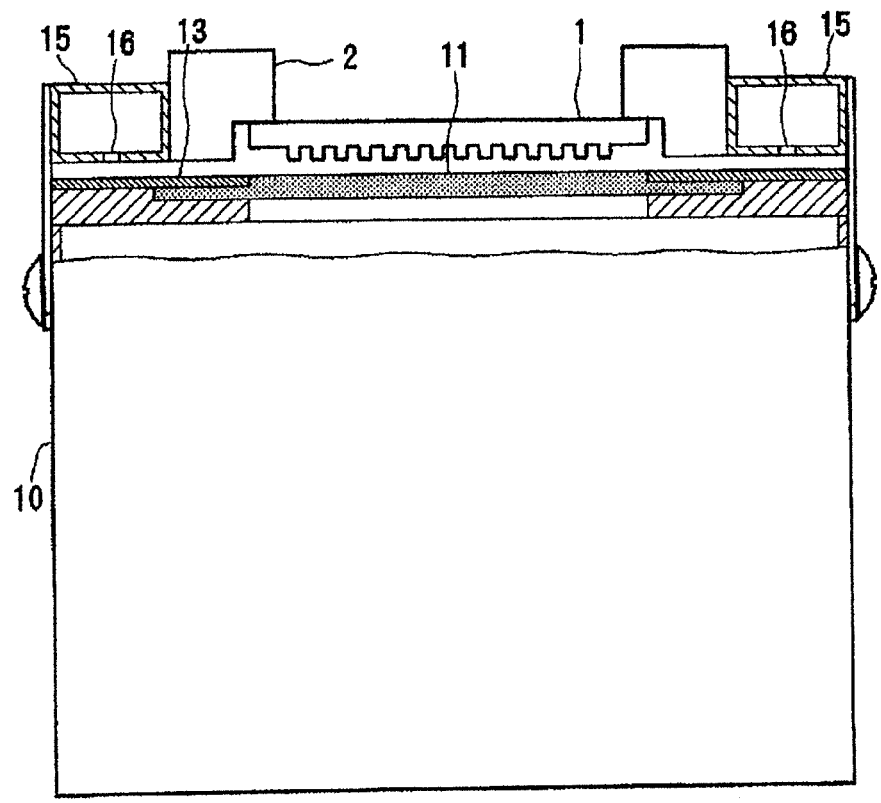
FIG. 10 is a schematic explanatory sectional view showing another modification of the optical irradiation equipment according to the present invention.

Further, if the width of the template holding mechanism 2 is smaller than the width of the cage body 10, it is also possible as shown in FIG. 10 to use gas passage elements 15 in which a plurality of gas flow openings 16 has been formed side by side along the axial direction of the tube at the bottom face, and to arrange these gas passage elements 15 along both side edges of the upper face of the cage body 10 with a spacing in the upward direction from the upper face of said cage body 10.

Figure 11:
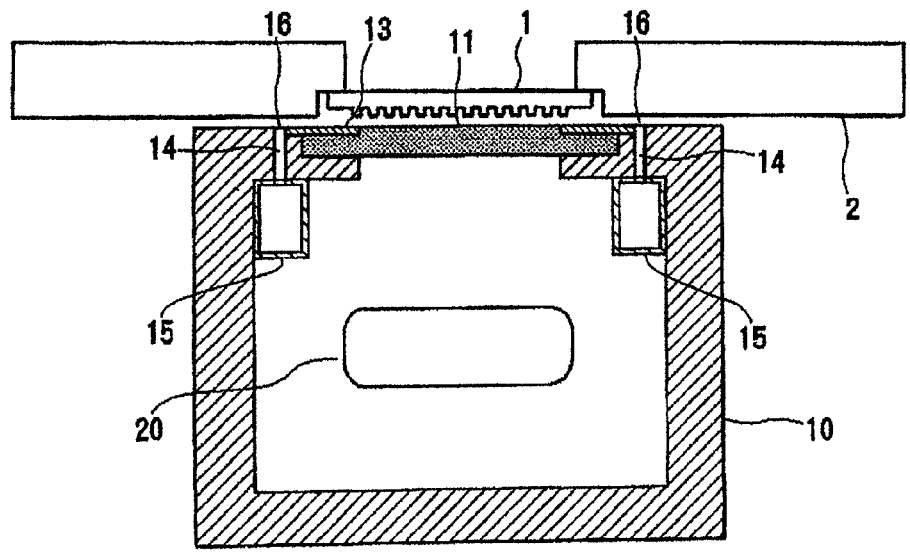
FIG. 11 is a schematic explanatory sectional view showing still another modification of the optical irradiation equipment according to the present invention.

Further, if the width of the template holding mechanism 2 is larger than the width of the cage body 10, as shown in FIG. 11 also a configuration is possible in which the gas passage elements 15 are arranged at the upper inner faces in said cage body 10 and cooling gas is passed into the gap between the UV radiation transmission window 11 and the template 1 by ejecting the cooling gas from gas flow openings 16 formed at the periphery of the UV radiation transmission window 11 at the upper face of said cage body 10 via gas flow channels 14 extending from the interior of the gas passage elements 15 to the upper surface of the cage body 10.

Figure 12:
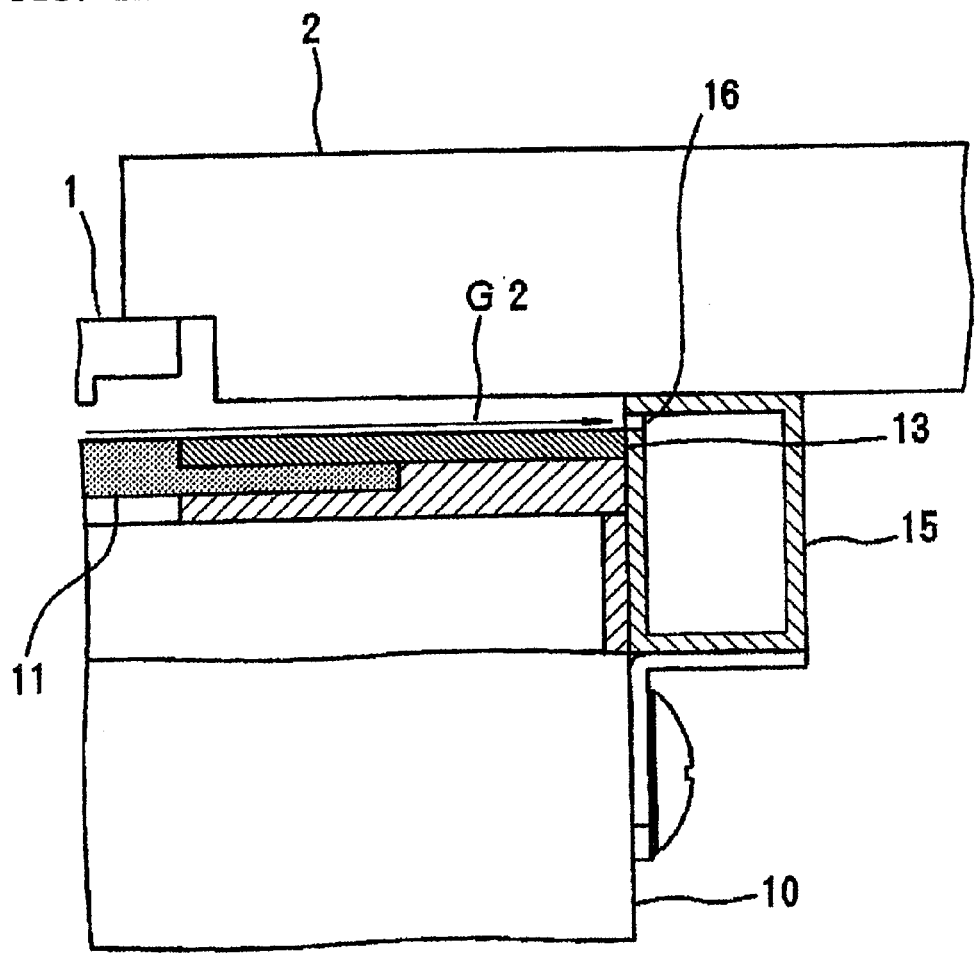
FIG. 12 is a schematic explanatory sectional view showing the condition in which cooling gas is passed into the gap between the template and the UV radiation transmission window by means of a cooling gas suction mechanism.

The gas passage elements 15 may also be connected to a cooling gas suction mechanism instead of a cooling gas supply mechanism. With such a configuration, cooling gas G2 being present at the periphery of gas flow openings 16 which are formed in the gas passage elements 15 is drawn into these openings by the operation of the cooling gas suction mechanism, as is shown in FIG. 12, and as a result the cooling gas is passed into the gap between the UV radiation transmission window 11 and the template 1.

Further, it is also possible that one gas passage element 15 is connected to a cooling gas supply mechanism while the other gas passage element 15 is connected to a cooling gas suction mechanism.

The object to be treated by the optical irradiation equipment of the present invention is not limited to templates in nanoimprint devices. An application to various objects which require a treatment with UV irradiation is possible.

Embodiment 1

An optical irradiation equipment with the following specifications was prepared according to the configuration of FIG. 1 to FIG. 3.
[Cage Body]
The dimensions of the lamp accommodation chamber were 100 mm×250 mm×80 mm. The UV radiation transmission window was made from quartz glass and had a length and width of 60×60 mm and a thickness of 4 mm.
[Gas Passage Elements]
The gas passage elements had an internal height and width of 8 mm×17 mm and a length of 200 mm. Eight circular gas flow openings with a diameter of 2 mm were formed with a pitch of 20 mm.
[Excimer Lamp]
The material of the discharge vessel was quartz glass. In the interior of the discharge vessel xenon gas was enclosed. The light emitting length was 50 mm, the light emitting width was 45 mm, and the output was 15 W.

This excimer lamp was arranged in the cage body 10 such that the face of the discharge vessel at which the high-voltage side electrode was arranged was positioned opposite to the UV radiation transmission window. The spacing between the excimer lamp and the UV radiation transmission window was 30 mm.

For the object to be treated, a template consisting of quartz glass with dimensions of the pattern region of the pattern face of 53 mm×53 mm and a thickness of 5 mm was prepared.

The above-mentioned optical irradiation equipment was arranged at the pattern face of this template such that the UV radiation transmission window was positioned opposite to the pattern face of the template in a nanoimprint device via a gap of 1 mm, and K-thermocouples for a temperature measurement were mounted at the UV radiation transmission window and at the template. Further, an UV irradiation treatment of the template was performed by lighting the excimer lamp while air with a temperature of 25° C. being the cooling gas was passed via the gas flow openings into the gap between the UV radiation transmission window and the template by means of operating a gas supply mechanism connected to the gas passage elements. The flow amount of the cooling gas which was passed into the gap between the UV radiation transmission window and the template was 200 l/min.

The relation between the time of the UV irradiation treatment of the template and the increase of the temperature of the template and the UV radiation transmission window was examined. The results are shown in FIG. 13.

Comparison Example 1

The optical irradiation equipment prepared in embodiment 1 was used, an UV irradiation treatment of the template was performed in the same way except that no cooling gas was passed into the gap between the UV radiation transmission window and the template, and the relation between the time of the UV irradiation treatment of the template and the increase of the temperature of the template and the UV radiation transmission window was examined. The results are shown in FIG. 13.

Figure 13:
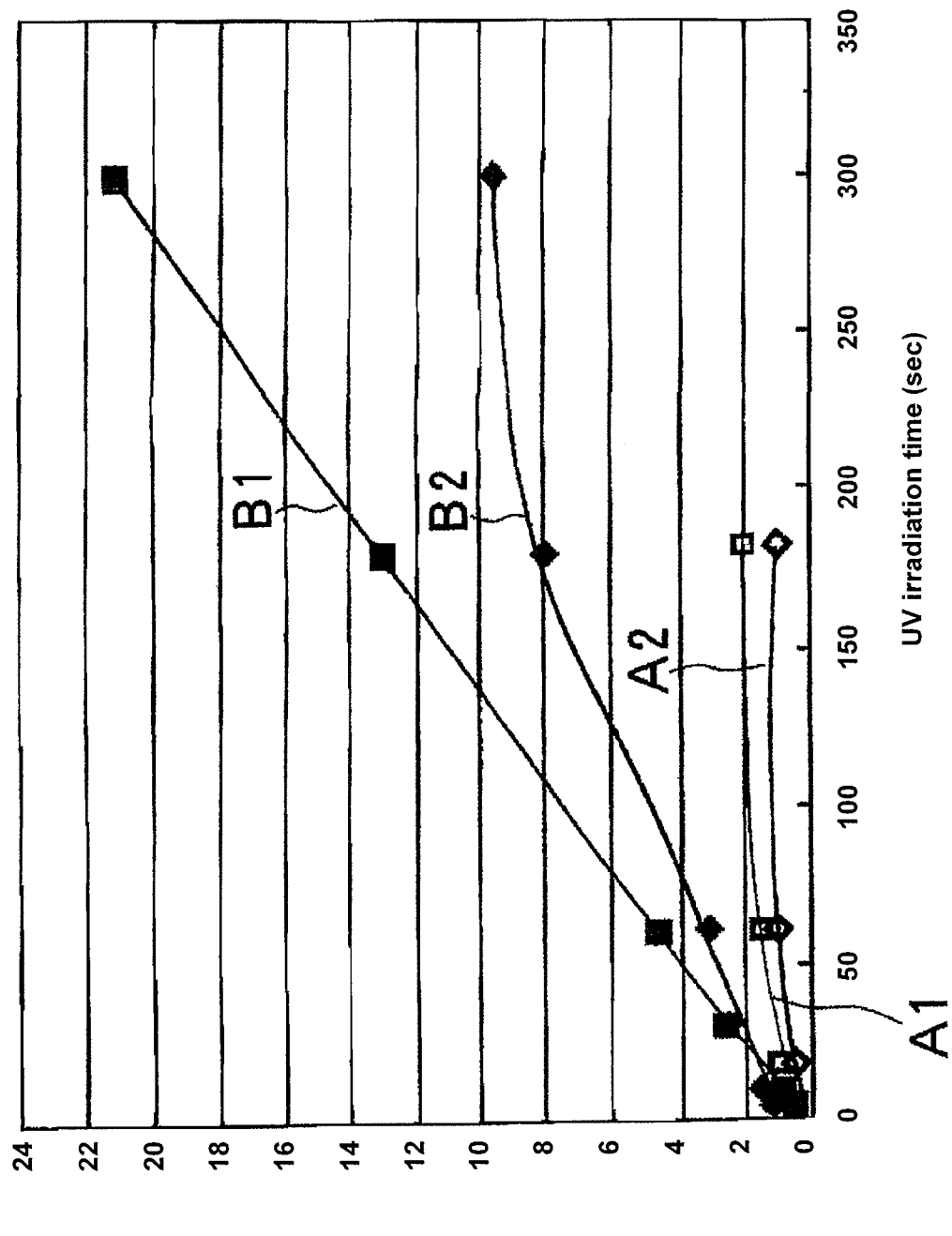
FIG. 13 is a diagram of the temperature increase of the UV radiation transmission window and the template measured for embodiment 1 and comparison example 1.

In FIG. 13, A1 shows the curve of the temperature increase of the UV radiation transmission window in embodiment 1, A2 shows the curve of the temperature increase of the template in embodiment 1, B1 shows the curve of the temperature increase of the UV radiation transmission window in comparison example 1, and B2 shows the curve of the temperature increase of the template in comparison example 1.

As is obvious from FIG. 13, it was confirmed that by means of the optical irradiation equipment according to embodiment 1 it was possible to perform an UV irradiation treatment while a temperature increase of the object to be treated was suppressed.

What is claimed is:

1. Optical irradiation equipment for dry cleaning treatment of a template in a nanoimprint device provided with a cage body having an UV radiation transmission window positioned opposite a pattern surface of the template with an empty space between the transmission window and said template, and an excimer lamp which is arranged in an interior of said cage body, wherein gas flow openings at a periphery of the UV radiation transmission window are connected to one of a cooling gas supply mechanism and a cooling gas suction mechanism for passing cooling gas via said gas flow openings into the empty space between said UV radiation transmission window and said template.

2. The optical irradiation equipment according to claim 1, wherein said excimer lamp has a discharge vessel with an overall shape of a flat plate, a high-voltage side electrode being arranged at one face of this discharge vessel, and an earth-side electrode being arranged at another face of said discharge vessel, wherein the face of said discharge vessel at which said high-voltage side electrode is arranged is positioned opposite to said UV radiation transmission window.

3. An optical irradiation method comprising a step of arranging an optical irradiation equipment being provided with a cage body having an UV radiation transmission window positioned opposite and with a gap to a pattern surface of a template in a nanoimprint device, and an excimer lamp which is arranged in an interior of said cage body,
    a step of passing cooling gas into the empty space between said UV radiation transmission window and said template via gas flow openings which are provided at a periphery of said UV radiation transmission window and which are connected to one of a cooling gas supply mechanism and
    a cooling gas suction mechanism, and a step of radiating UV radiation from said excimer lamp via said UV transmission window to the pattern face of said template by lighting said excimer lamp.

* * * * *